(12) United States Patent
Kim (10) Patent No.: US 6,765,842 B2
(45) Date of Patent: Jul. 20, 2004

(54) HOLE DRIVER IN SEMICONDUCTOR MEMORY DEVICE

(75) Inventor: Kwan-Weon Kim, Kyoungki-do (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 0 days.

(21) Appl. No.: 10/331,791

(22) Filed: Dec. 30, 2002

(65) Prior Publication Data

US 2003/0142575 A1 Jul. 31, 2003

(30) Foreign Application Priority Data

Dec. 29, 2001 (KR) ........................................ 2001-87676

(51) Int. Cl.[7] .............................................. G11C 8/00
(52) U.S. Cl. .................................. 365/230.03; 365/203
(58) Field of Search ............................. 365/203, 230.03

(56) References Cited

U.S. PATENT DOCUMENTS 6,031,779 A * 2/2000 Takahashi et al. .......... 365/226
6,175,516 B1 * 1/2001 Kitsukawa et al. ........... 365/63

* cited by examiner

Primary Examiner—M. Tran
(74) Attorney, Agent, or Firm—Marshall, Gerstein & Borun LLP (57) ABSTRACT

A hole driver for driving a hole in a semiconductor memory device, including a first bank controller for generating a control signal for controlling a X-hole of a first bank in response to a row active signal and a precharge signal for the first bank, a second bank controller for generating a control signal for controlling a X-hole of a second bank in response to a row active signal and a precharge signal for the second bank, a block address enable means for generating a common block address enable signal in response to output signals of the first and the second bank control means and a common block address predecoder for predecoding block address signal for each bank in response to the common block address enable signal.

7 Claims, 10 Drawing Sheets

HOLE DRIVER IN SEMICONDUCTOR MEMORY DEVICE

TECHNICAL FIELD

A hole driver of a row address path for a semiconductor memory device is disclosed.

DESCRIPTION OF RELATED ART

Generally, a semiconductor memory device has a row address path and a column address path. Blocks configuring the row address path and signals are represented as a symbol 'X' and blocks configuring the column address path and signals are represented as a symbol 'Y'.

The row address path includes a row control block, a row address strobe (RAS) signal generating block, an address latch block and a X-hole block.

Figure 1:
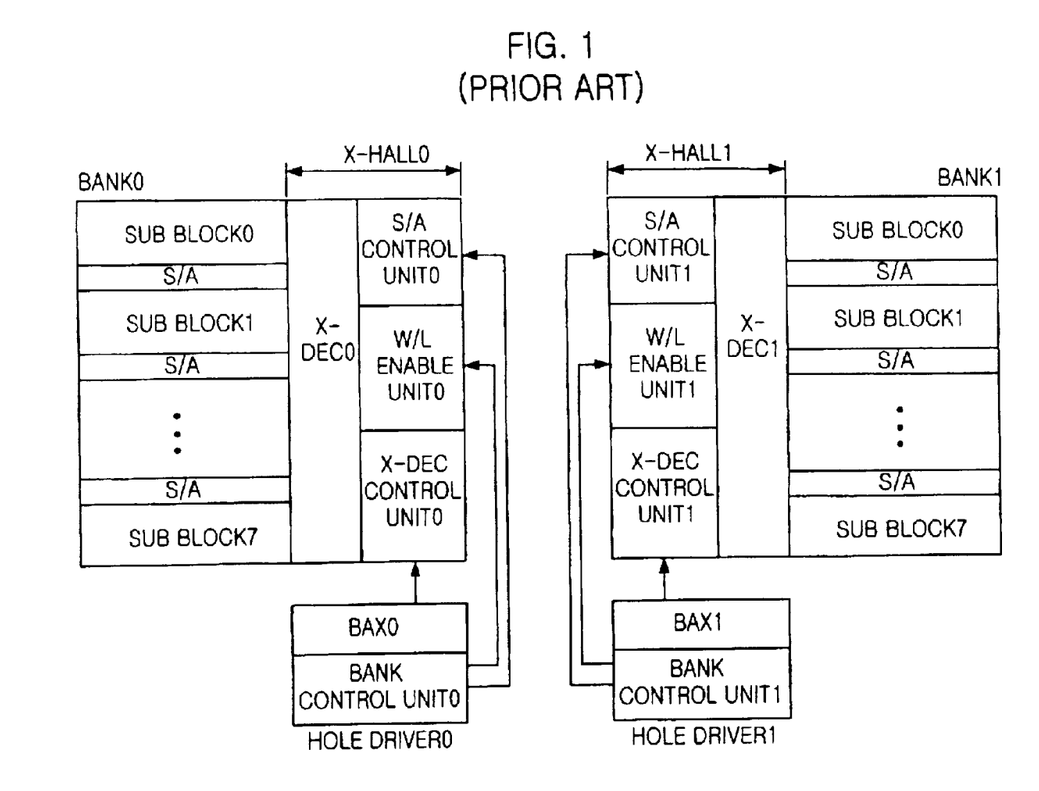
FIG. 1 is a block diagram illustrating a conventional row address path.

FIG. 1 is a block diagram illustrating the row address path. The semiconductor memory device, i.e., specially, DRAM has a plurality of banks. Two banks BANK0 and BANK1 are shown in FIG. 1. Each bank has a plurality of sub blocks including a cell array. A sense amplifier S/A is disposed between each sub block. Each bank further has an X-hole including a row decoder X-DEC, a sense amplifier control unit, a wordline (W/L) enable control unit and an X-DEC control unit.

The semiconductor memory device has a hole driver or driver circuit for driving the X-hole, the hole driver including a bank control unit and a block address pre-decoder BAX. The bank control unit drives the sense amplifier control unit S/A and the W/L enable unit in the corresponding X-hole by receiving an output of a row address strobe signal generating block (not shown) and the block address pre-decoder drives the X-decoder control unit in corresponding X-hole by pre-decoding an address outputted from an address latch block (not shown) under control of the bank control unit.

In addition, when the output of the block address pre-decoder BAX is directly applied to the row decoder X-DEC, since drivability of the output thereof decreases due to a high load, a local address pre-decoder LAX is further included in the X-DEC control unit in the X-hole.

Figure 2:
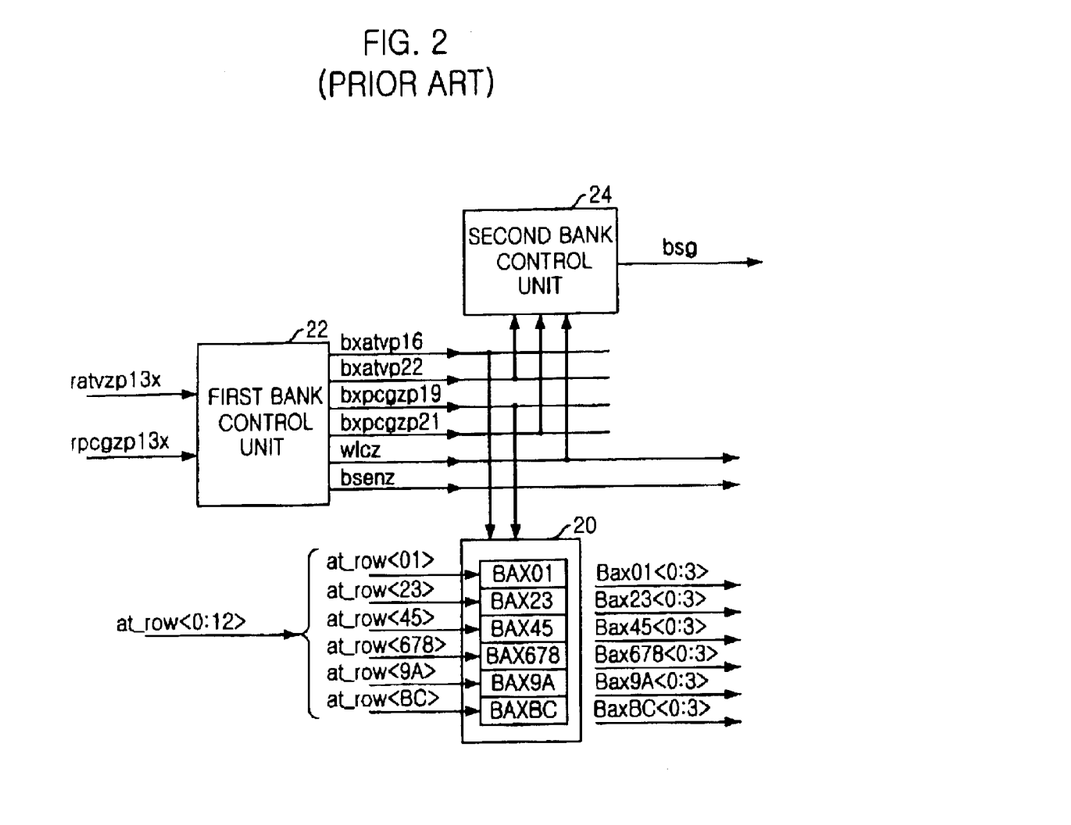
FIG. 2 is a block diagram illustrating the conventional hole driver shown in FIG. 1.

FIG. 2 is a block diagram illustrating the conventional hole driver in FIG. 1.

As shown, the hole driver includes a first bank control unit 22, a second bank control unit 24 and a block address pre-decoder 20. The first bank control unit 22 receives a row active pulse signal ractzp13x and a row precharge pulse signal rpcgzp13x outputted from the row address strobe signal generating block (not shown) and generates bank active pulse signals bxatvp16 and bxatvp22, bank precharge pulse signals bxpcgzp19 and bxpcgzp21, a wordline clear signal wlcz and a wordline enable control signal bsenz. The second bank control unit 24 receives the bank active pulse signal bxatvp22, the bank precharge pulse signal bxpcgzp21 and the wordline clear signal wlcz and generates a sense amplifier operation starting signal bsg. The block address pre-decoder 20, which includes a plurality of sub blocks BAX01, BAX23, BAX45, BAX678, BAX9A and BAXBC, pre-decodes the row address signals at-row<0:12> outputted from the row address latch block (not shown) in response to the bank active pulse signal bxatvp16 and the bank precharge pulse signal bxpcgzp19.

Figure 3:
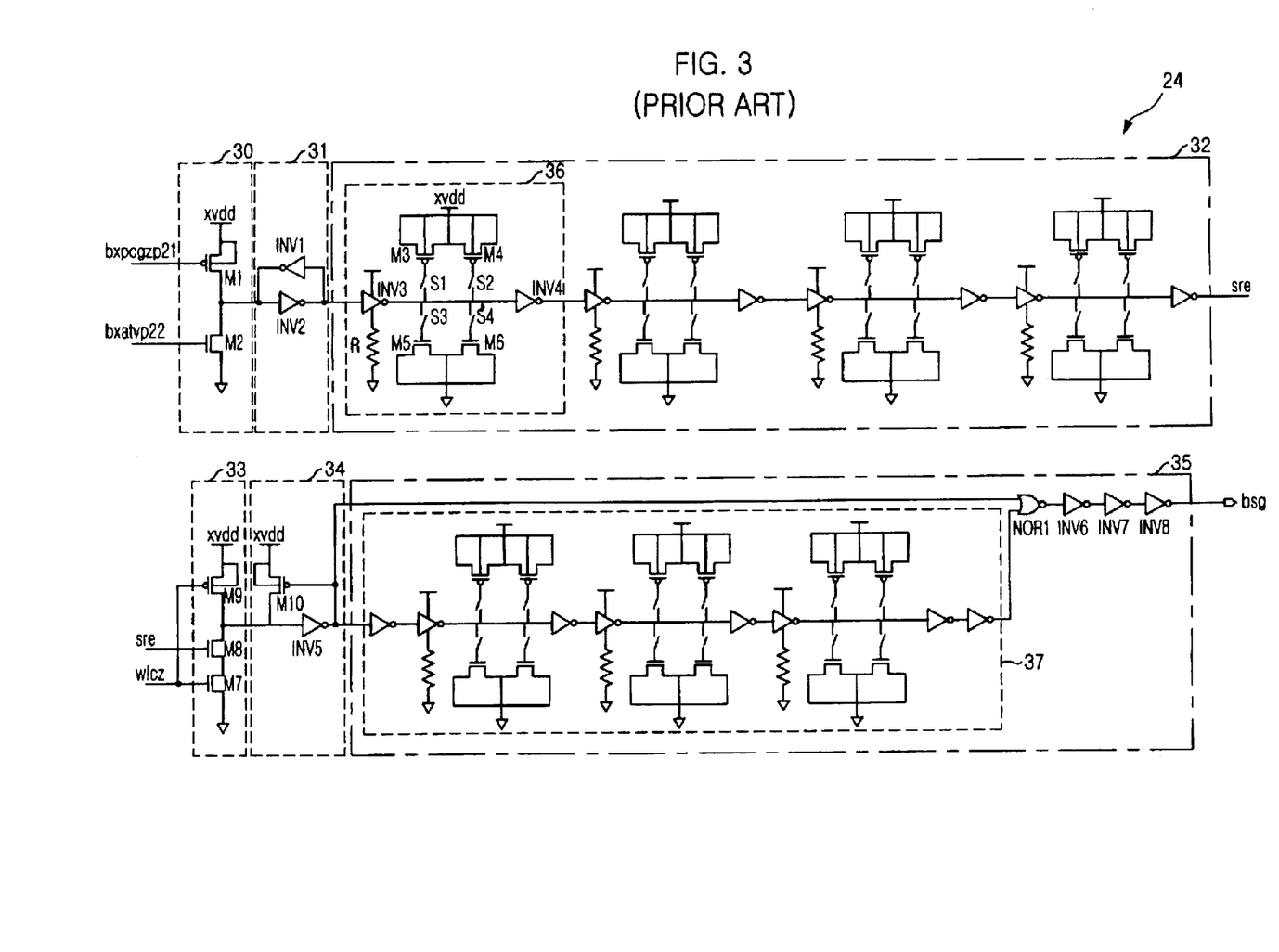
FIG. 3 is a circuit diagram illustrating the second bank control unit shown in FIG. 2.

FIG. 3 is a circuit diagram illustrating the second bank control unit 24 in FIG. 2.

As shown, the second bank control unit 24 includes a first driver 30, a first inverter latch 31, a first delay 32, a second driver 33, a second inverter latch 34 and a pulse generator 35. The first driver 30 includes a PMOS transistor M1 and an NMOS transistor M2, whose gates receives the bank precharge pulse signal bxpcgzp21 and the bank active pulse signal, respectively. The first inverter latch 31 includes two inverters INV1 and INV2 connected to an output of the first driver 30 and the first delay 32 delays an output of the first inverter latch 31 for a predetermined time. The second driver 33 includes an NMOS transistor M7 whose gate receives the wordline clear signal wlcz, an NMOS transistor M8 whose gate receives an output signal of the first delay 32 and a PMOS transistor whose gate receives the wordline clear signal wlcz, wherein the transistors M9, M8 and M7 are connected in series between a power supply voltage xvdd and a ground voltage. The second inverter latch 34 includes an inverter INV5 connected to an output terminal of the second driver 33 and a PMOS transistor M10 for supplying a power supply voltage to the output terminal of the second driver 33 by receiving an output of the inverter INV5 to a gate thereof. The pulse generator 35 generates the sense amplifier operation starting signal bsg by receiving an output signal of the second inverter latch 34.

The first delay 32 includes a plurality of unit delays 36. The unit delay 36 includes a CMOS inverter INV3 having a resistance R connected a pull-down terminal thereof, MOS transistors M3, M4, M5 and M6 and switches S1, S2, S3 and S4 configuring a capacitor load and an inverter INV4.

The pulse generator 35 includes a second delay 37 for delaying an output signal of the second inverter latch 34 for a predetermined time, a NOR gate NOR1 receiving the output signal from the second inverter latch 34 and an output signal of the second delay 37, inverters INV6, INV7 and INV8 for buffering an output signal from the NOR gate NOR1 and outputting the sense amplifier operation starting signal bsg. The second delay 37 includes a plurality of unit delays, which are the same with those of the first delay 32.

The output signal of the second bank control unit 24, that is to say, the sense amplifier operation starting signal bsg is a flag signal for notifying when a driving operation of the sense amplifier is carried out after corresponding wordlines are completely enabled by inputting all row address signals to the X-hole and charge sharing operation for a bitline and a memory cell is completed.

Figure 4:
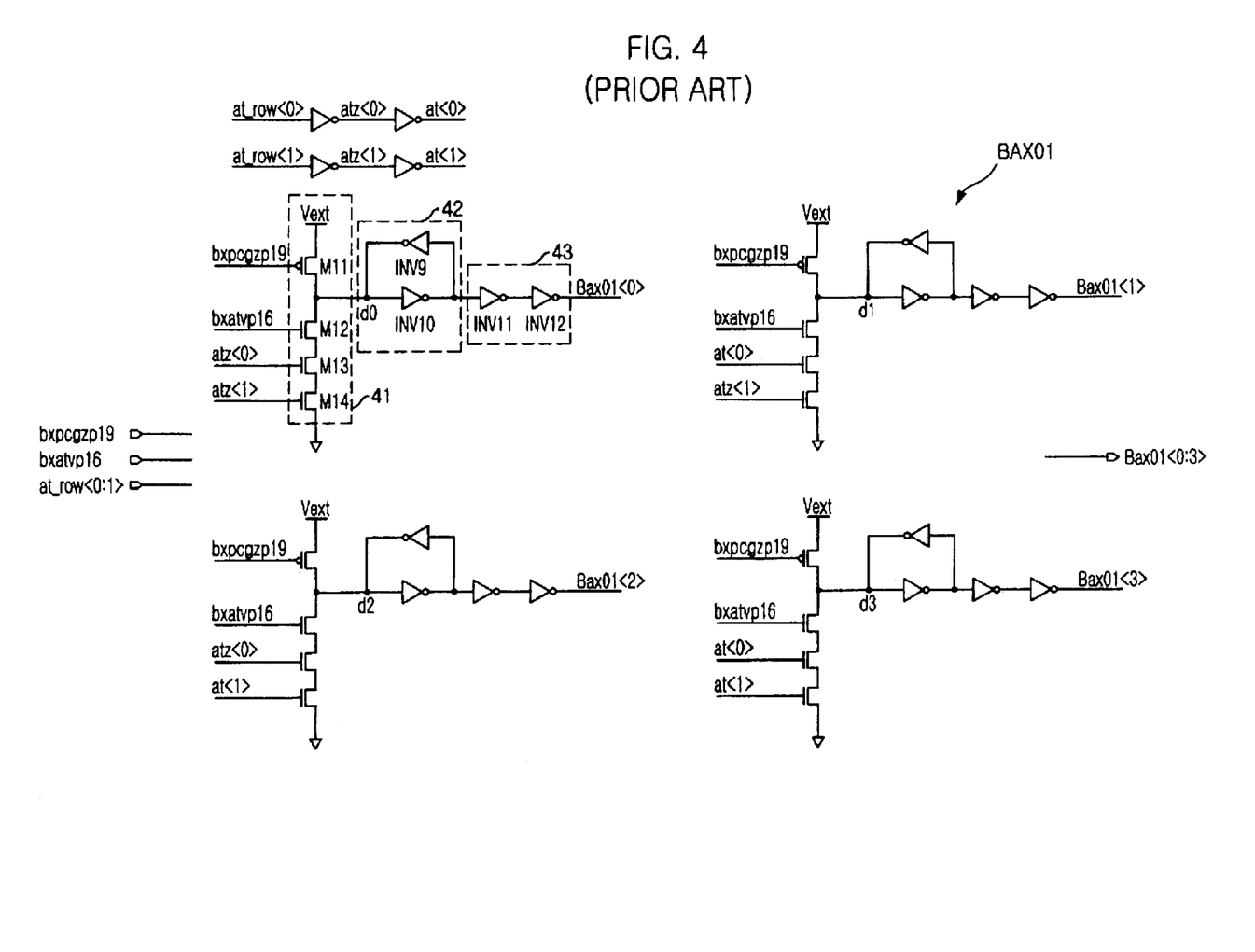
FIG. 4 is a circuit diagram illustrating a first sub block BAX01 in the block address predecoder.

FIG. 4 is a circuit diagram illustrating a first sub block BAX01 in the block address predecoder 20 (see FIG. 2).

As shown, the first sub block BAX01 receives the row address signal at_row<01> and outputs predecoded row address signals Bax01<0:3>. A circuit for generating the BAX01<0> signal includes a driver 41, a latch 42 and a buffer 43. The driver 41 consists of a PMOS transistor M11 and NMOS transistors M12, M13 and M14 connected in series between a external voltage Vext and a ground voltage. The bank precharge pulse signal bxpcgzp19 is applied to a gate of the PMOS transistor M11. The bank active pulse signal bxatvp16, an address signal atz<0> and an address signal atz<1> are applied to gates of the NMOS transistors M12, M13 and M14, respectively. The address signal atz<0> is an inverted row address signal at_row<0> and the address signal atz<1> is an inverted row address signal at_row<1>. Also, an address signal at<0> is an inverted address signal atz<0> and an address signal at<1>is an inverted address signal atz<1> shown in FIG. 4.

The latch 42 consists of two inverters INV9 and INV10 and an output of the driver 41, which is a junction of the PMOS transistor M11 and the NMOS transistor M12, is connected to an input of the inverter INV10. The buffer 43 includes a plurality of inverters INV11 and INV12 for outputting the Bax01 signal.

Circuits for generating the predecoded Bax01<1>, Bax01<2> and Bax01<3>signals are similar to the circuit for generating the Bax<0> signal. The differences are that the address signals at<0> and atz<1> are applied to generate the Bax01<1> signal instead of the address signals atz<0> and atz<1> and the address signals atz<0> and at<1> are applied to generate the Bax01<2> signal. Also, the address signals at<0>and at<1> are applied to generate the Bax01<3> signal.

If a row active command is applied from an external circuit, a row address strobe (RAS) signal and an address signal are inputted at the same time, so that the row active pulse signal ractzp13x signal is generated. The first bank control unit 22 of the hole driver generates the bank active pulse signal bxatvp16 by receiving the row active pulse signal ractzp13x. The block address predecoder 20 receives the bank active pulse signal bxatvp16 and latches corresponding row address signals until the precharge command is applied from the external circuit. Namely, the corresponding address signals have to be latched until the precharge command is inputted after a plurality of address lines Bax01<0:3>, Bax23<0:3>, Bax45<0:3>, Bax678<0:3>, Bax9A<0:3> and BaxBC<0:3> are enabled by activating corresponding bank.

Recently, in a memory device, specifically, e.g., a synchronous memory device, while one of banks is active, since another bank can be activated, the address lines connected to the block address predecoder have to be independently configured for each bank. Since the address lines connected to the block address predecoder is maintained in an active state by a precharge mode, a plurality of banks cannot share the block address predecoder.

Accordingly, a large area is occupied by the block address predecoder at each bank and the number of address lines is increased, so that there is a problem that the size of semiconductor memory chip must be increased which is contrary to the trends in this industry.

SUMMARY OF THE DISCLOSURE

Therefore, a hole driver or driver circuit is disclosed capable of reducing the chip size of a semiconductor memory device by sharing the block address predecoder with a plurality of banks.

One disclosed hole driver or driver circuit comprises: a first bank control unit for generating a control signal for controlling a X-hole of a first bank in response to a row active signal and a precharge signal for the first bank; a second bank control unit for generating a control signal for controlling a X-hole of a second bank in response to a row active signal and a precharge signal for the second bank; a block address enable unit for generating a common block address enable signal in response to output signals of the first and the second bank control means; and a common block address predecoding unit for predecoding block address signal for each bank in response to the common block address enable signal.

BRIEF DESCRIPTION OF THE DRAWINGS

The above and other features of the disclosed hole driver will become apparent from the following description of preferred embodiments taken in conjunction with the accompanying drawings, in which.

DETAILED DESCRIPTION OF THE PRESENTLY PREFERRED EMBODIMENTS

Hereinafter, a hole driver or driver circuit capable of sharing a block address predecoder with a plurality of banks in a semiconductor memory device will now be described in detail referring to the accompanying drawings.

Figure 5:
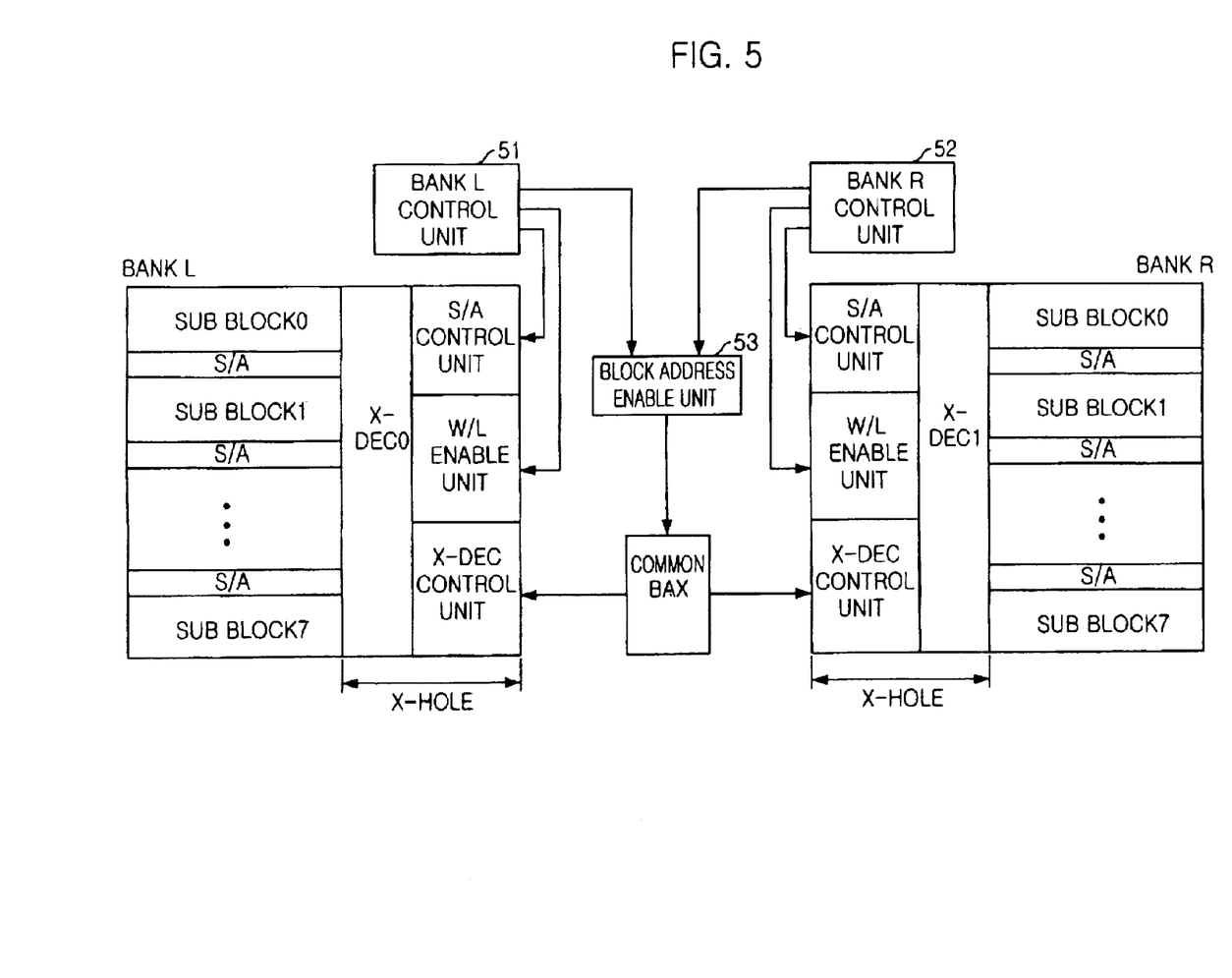
FIG. 5 is a block diagram illustrating a row address path in accordance with the preferred embodiment of the present invention.

FIG. 5 is a block diagram illustrating a row address path in accordance with the preferred embodiment of the present invention.

Two banks, which are a right bank BANK R and a left bank BANK L, are shown in FIG. 5. Each bank includes a plurality of sub blocks having a cell array and a bitline sense amplifier S/A is disposed between sub blocks. Also, each bank includes a row decoder (X-DEC), a sense amplifier (S/A) control unit, a wordline (W/L) enable control unit and a X-DEC control unit.

A left bank control unit 51 and a write bank control unit 52 are included in the row address path for each X-hole and a block address enable circuit 53 is included for selectively enabling the left bank BANk L or the write bank BANK R in response to output signals of two bank control units 51 and 52. Also, a common block address predecoder 50 is included in the row address path for driving the X-DEC control unit included in the left bank BANK L or the write bank BANK R under control of the block address enable circuit 53.

Figure 6:
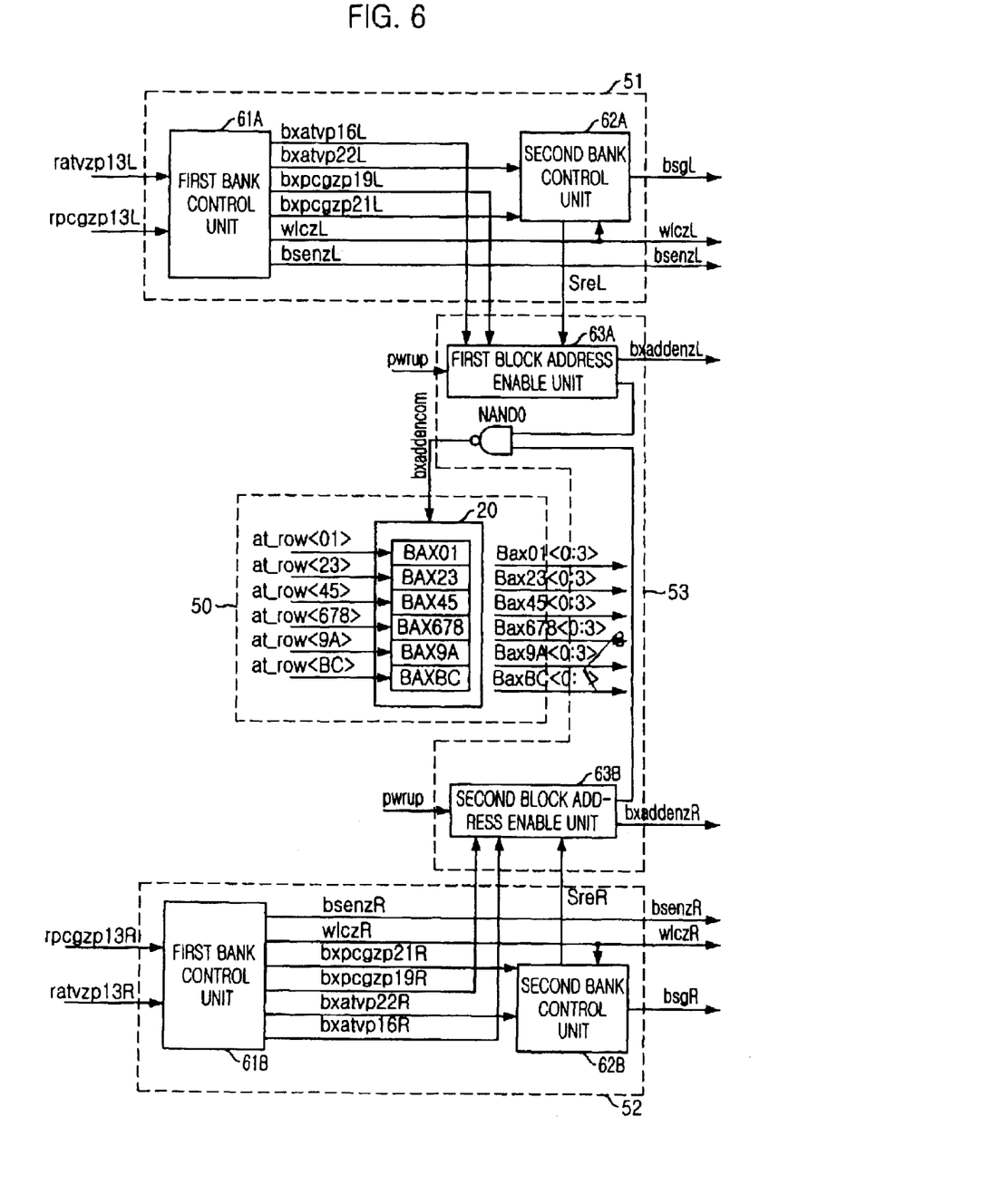
FIG. 6 is a block diagram illustrating a hole driver in accordance with the preferred embodiment of the present invention.

FIG. 6 is a block diagram illustrating a hole driver in accordance with the preferred embodiment.

As shown, the hole driver includes the left bank control unit 51, the write bank control unit 52, the bank block address enable circuit 53 and the common block address predecoder 50. The left bank control unit 51 includes a first bank control unit 61A and a second bank control unit 62A. The first bank control unit 61A receives a row active pulse signal ractzp13L and a row precharge pulse signal rpcgzp13L generated from a row address strobe signal generation block (not shown) and generates bank active pulse signals bxatvp16L and baxtvp22L, bank precharge pulse signals bxpcgzp19L and bxpcgzp21L, a wordline clear signal wlczL and a wordline enable control signal bsenzL. The second bank control unit 62A receives the bank active pulse signal baxtvp22L, the bank precharge pulse signal bxpcgzp21L and the wordline clear signal wlczL and generates a sense amplifier operation starting signal bsgL.

The write bank control unit 52 includes a first bank control unit 61B and a second bank control unit 62B. The first bank control unit 61B receives a row active pulse signal ractzp13R and a row precharge pulse signal rpcgzp13R generated from a row address strobe signal generation block (not shown) and generates bank active pulse signals bxatvp16R and baxtvP22R, bank precharge pulse signals bxpcgzp19R and bxpcgzp21R, a wordline clear signal wlczR and a wordline enable control signal bsenzR. The second bank control unit 62B receives the bank precharge pulse signal bxpcgzp21R, the bank active pulse signal bxatvp22R and the wordline clear signal wlczR and generates a sense amplifier operation starting signal bsgR.

The block address enable circuit 53 includes a first block address enable unit 63A under control of the left bank control unit 51, a second block address enable unit 63B under control of the write bank control unit 52 and a logic combination unit, i.e., an NAND gate, for logically combining output signals of the each block address enable units 63A and 63B.

The common block address predecoder 50 predecodes row address signals at_row<0:12> outputted from a row address latch block (not shown) in response to a common block address enable signal bxaddencom outputted from the common block address enable circuit 53. As shown in FIG. 6, two banks share one block address predecoder 50 in the hole driver in accordance with the present invention.

Figure 7:
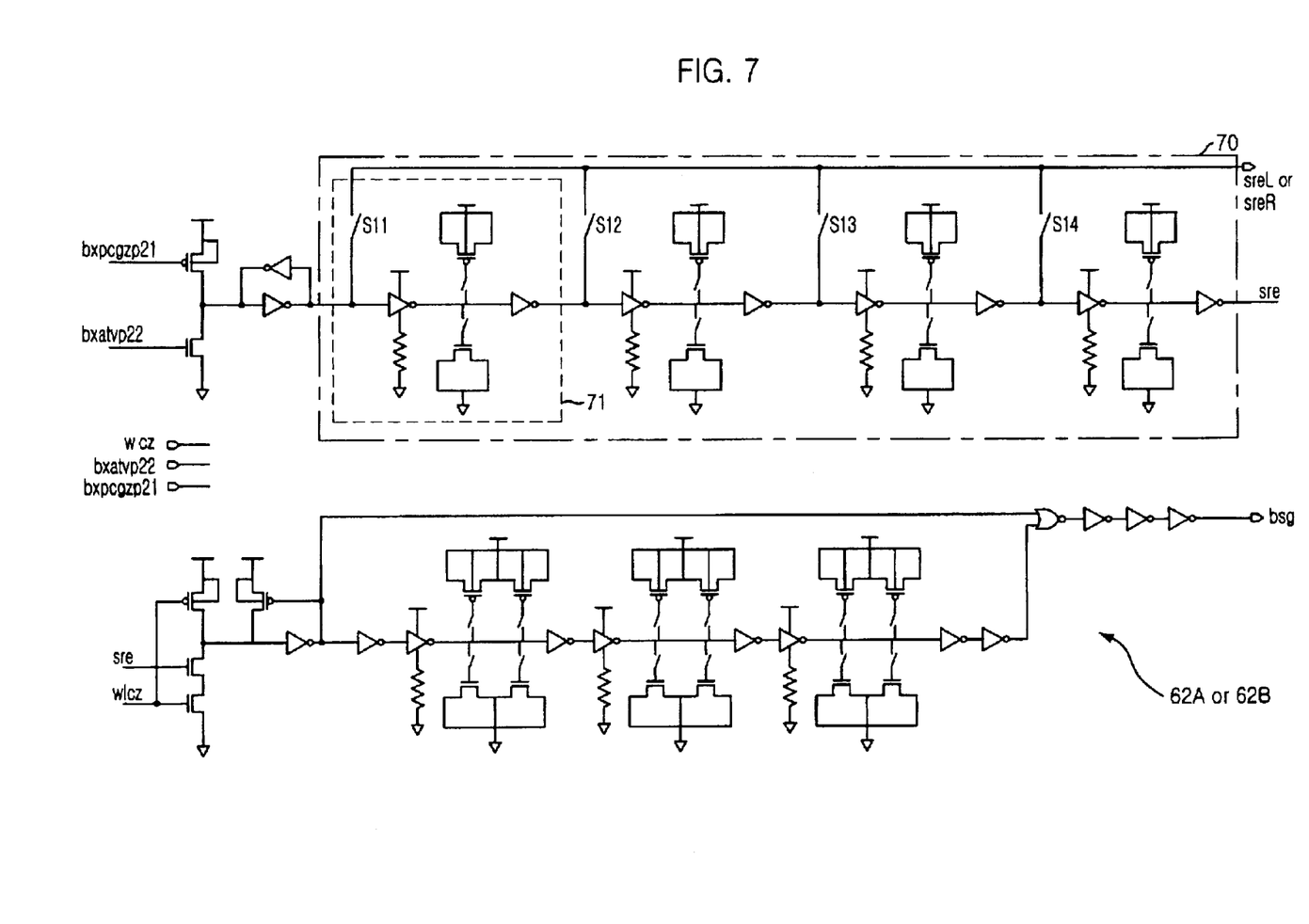
FIG. 7 is a circuit diagram illustrating the second bank control unit in FIG. 6.

FIG. 7 is a circuit diagram illustrating the second bank control unit 62A or 62B in FIG. 6.

As shown, the configuration of the second bank control unit is similar to that of the conventional second bank control unit shown in FIG. 3. However, a delay unit 70 in the second bank control unit 62A or 62B is differently configured to generate an address setting margin control signal sreL or sreR except the sre signal, from the delay unit 32 in FIG. 3.

The delay unit 70 has switches S11, S12, S13 or S14 for each unit delay 71, so that the sreL signal or the sreR signal, which has a different delay with the sre signal, is generated. The sreL signal is generated form the second bank control unit 62A in the left bank control unit 51 and the sreR signal is generated from the second bank control unit 62B in the write bank control unit 52.

Figure 8:
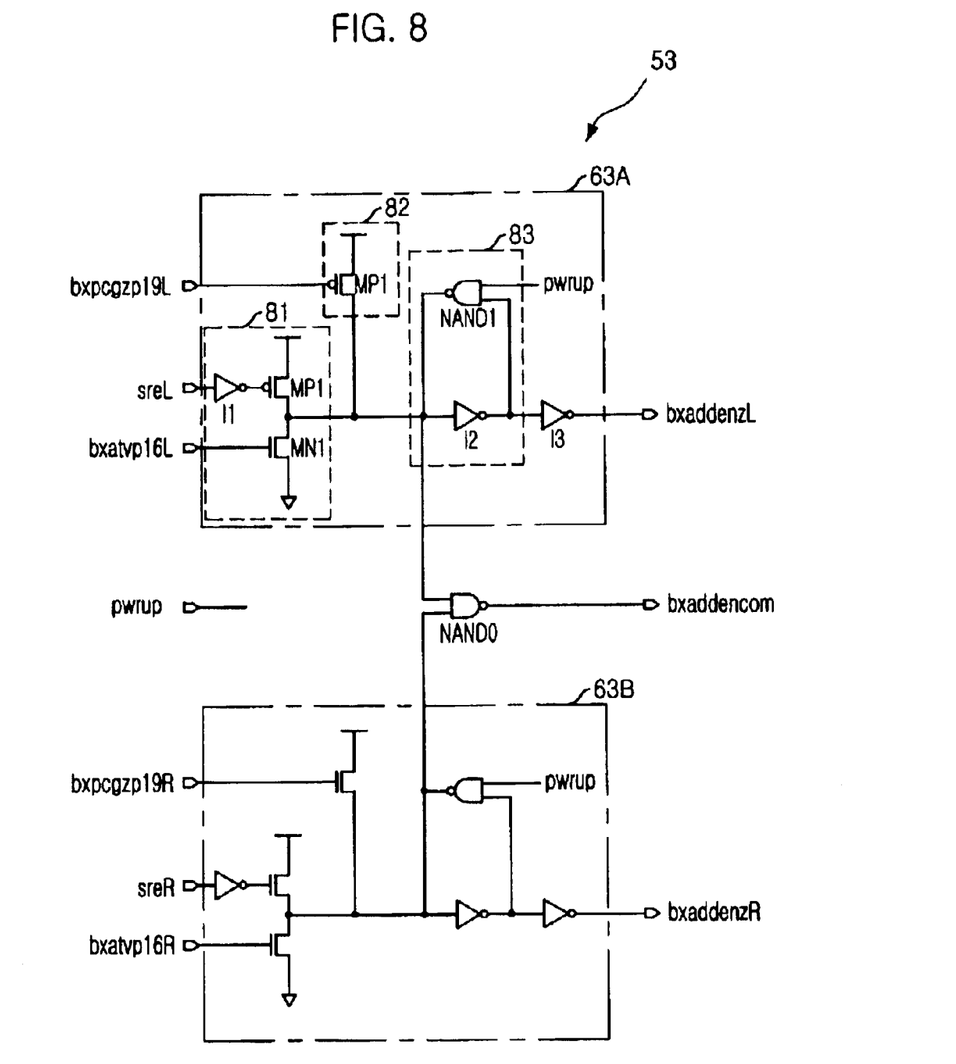
FIG. 8 is a circuit diagram illustrating the block address enable circuit in FIG. 6.

FIG. 8 is a circuit diagram illustrating the block address enable circuit 53 in FIG. 6.

As shown, the block address enable circuit 53 includes the first block address enable unit 63A under the control of the output signal from the left bank control unit 51, the second block address enable unit 63B under the control of the output signal of the write bank control unit 52 and the NAND gate NAND0 for logically combining the output signals of the first and second block address enable units 63A and 63B.

The first block address enable unit 63A includes a driver 81, a reset unit 82 and a latch 83. The driver 81 includes an NMOS transistor whose gate receives the bank active pulse signal bxatvp16L and a first PMOS transistor MP1 whose gate an inverted sreL signal trough a first inverter I1. The reset unit 82, which consists of a second PMOS transistor MP2 whose gate receives the bank precharge pulse signal bxpcgp19L, is coupled to an output of the driver 81. The latch 83 consists of a second inverter I2 receiving the output signal of the driver 81 and an NAND gate NAND1 receiving a power up signal pwrup and an output signal of the second inverter I2. The block address enable unit 63A further includes a third inverter I3 for outputting a block address enable signal bxaddenzL by inverting an output signal of the latch 83.

Also, the configuration of the second block address enable unit 63B is similar to that of the first block address enable unit 63A and the second block address enable unit 63B generates a block address enable signal bxaddenzR.

The NAND gate NAND0, which receives output signals of the drivers of the first and second block address enable units 63A and 63B, generates the common block address enable signal bxaddencom.

Figure 9:
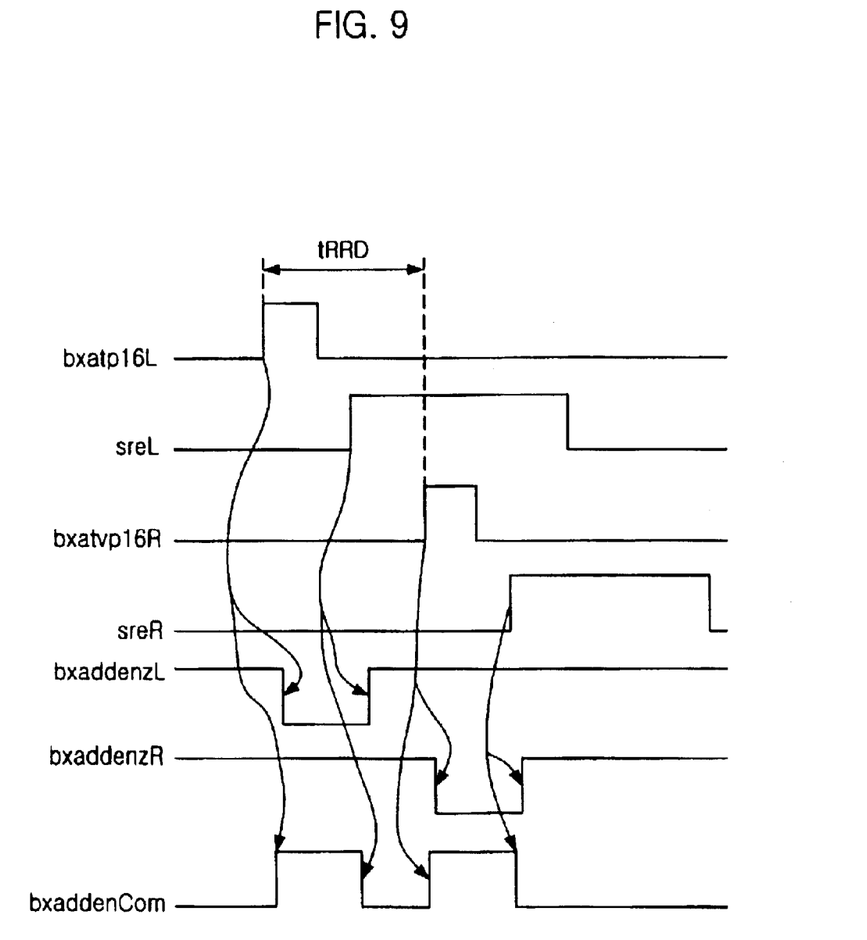
FIG. 9 is a timing diagram showing operations of the block address enable circuit in FIG. 8.

FIG. 9 is a timing diagram showing operations of the block address enable circuit 53 in FIG. 8.

As shown, if the bank active pulse signal bxatvp16 is enabled by selecting the left bank BANK L, the output of the driver 81 of the first block address enable unit 63A is enabled with a logic low level and the latch 83 stores an inverted output signal of the driver 81. Thereafter, if the sreL signal is enabled with a logic high level, the signal stored in the latch 83 is inverted, so that the block address enable signal bxaddenzL is enabled from an enable starting point of the bank active pulse signal bxatvp16 to an enable starting point of the sreL signal. The sreL and sreR signals are employed for securing a time necessary to set address signals after a corresponding bank is activated and it is preferable that the sreL and sreR signals are generated to have a sufficient time by considering the tRRD (RAS to RAS delay).

After tRRD, another bank may be selected. If the right bank BANK R is selected, the block address enable signal bxaddenzL is activated in the second block address enable unit 63B as the same above manner.

The common block address enable signal bxaddencom outputted from the NAND gate NAND0 is a pulse signal enabled from an enable starting point of the bank active pulse signal bxatv16L or bxatv16R to an enable starting point of the sreL or sreR signal. The common block address enable signal bxaddencom is activated by a necessary time for address signals after the bank is activated and then deactivated again.

Figure 10:
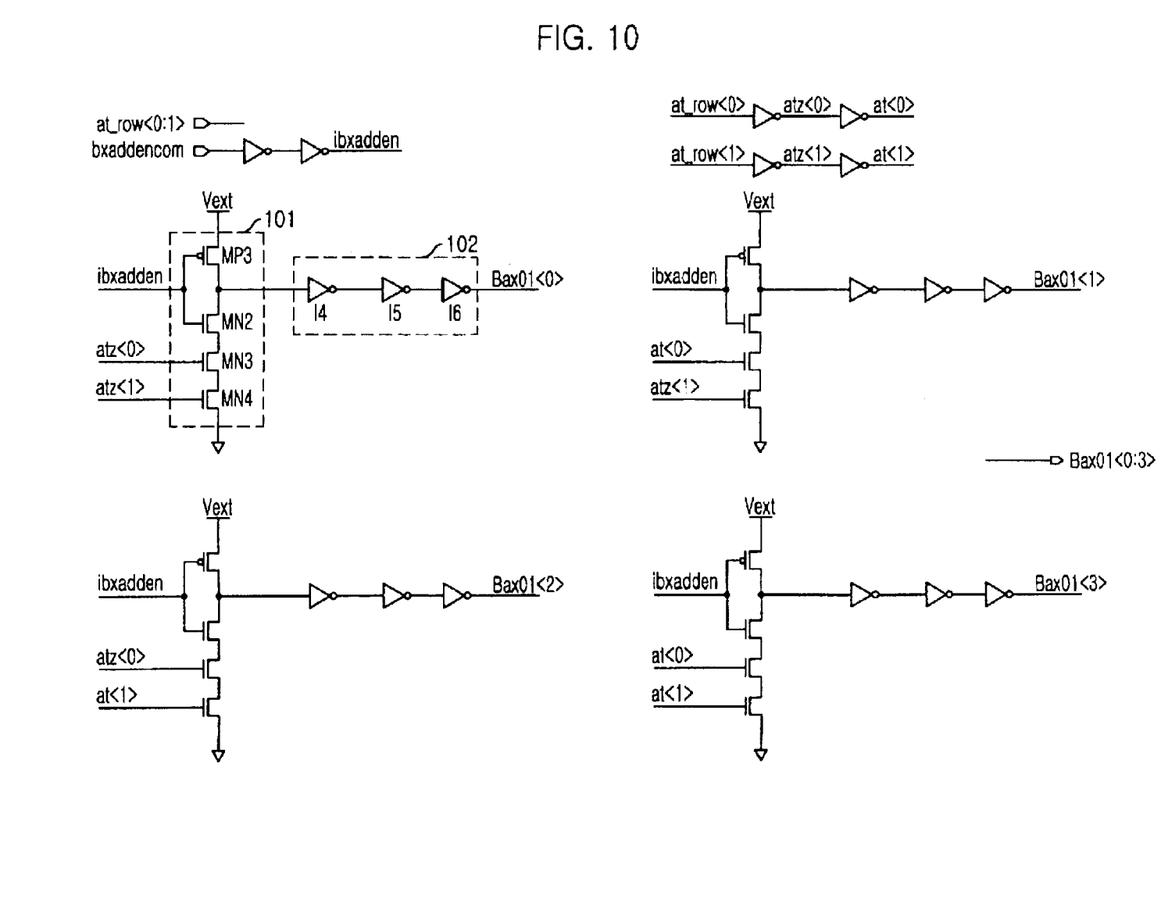
FIG. 10 is a circuit diagram illustrating a first sub block in the block address predecoder in FIG. 6.

FIG. 10 is a circuit diagram illustrating a first sub block BAX01 in the block address predecoder 20 in FIG. 6.

As shown, the first sub block BAX01 receives the row address signal at_row<0:1> and the common block address enable signal bxaddencom and outputs predecoded row address signals Bax01<0:3>. A circuit for generating the BAX01<0> signal includes a driver 101 and a driving unit 102. The driver 101 includes a plurality of MOS transistors MP3, MN2, MN3 and MN4 coupled in serried between an external power voltage and a ground voltage. The driving unit 102 includes a plurality of inverters I4, I5 and I6.

A buffered common block address enable signal ibxadden is applied to gates of the third PMOS transistor MP3 and the second NMOS transistor MN2. The buffered common block address enable signal is generated by buffering the common block address enable signal bxaddencom by considering a loading time thereof. Address signals atz<0> and atz<1> are applied to gates of the third NMOS transistors MN3 and MN4, respectively.

The driving unit 103 receives an output signal of the driver 101, which is generated from a junction of the third PMOS transistor MP3 and the second NMOS transistor MN2, and outputs the predecoded address signal Bax01<0>.

The address signal atz<0> is an inverted row address signal at_row<0> and the address signal atz<1> is an inverted row address signal at_row<1>. Also, an address signal at<0> is an inverted address signal atz<0> and an address signal at<1>is an inverted address signal atz<1> shown in FIG. 10.

Circuits for generating the predecoded address signals Bax01<1>, Bax01<2>and Bax01<3> are similar to the circuit for generating the predecoded address signal Bax<0>. The differences are that the address signals at<0> and atz<1> are applied to generate the predecoded address signal Bax01<1> instead of the address signals atz<0> and atz<1> and the address signals atz<0> and at<1> are applied to generate the predecoded address signal Bax01<2>. Also, the address signals at<0> and at<1> are applied to generate the predecoded address signal Bax01<3>. Also, another sub blocks in the block address predecoder 20 are identically configured with the first sub block BAX01.

Comparing the block address predecoder 50 with the conventional block address predecoder illustrated in FIG. 4, the control signal of the driver is different from each other and the latch coupled to the driver is removed in the preferred embodiment of the present invention. Since the latch is removed, the output signals Bax01<0:3> outputted from is enable only when the common block address enable signal bxaddencom is activated and disabled with a logic low level.

As illustrated in above, the block address predecoder and the address lines are shared to a plurality of banks in accordance with the present invention, so that the chip size of the semiconductor memory device can be reduced.

While the disclosed hole driver has been described with respect to the particular embodiments, it will be apparent to those skilled in the art that various changes and modifications may be made without departing from the spirit and scope of this disclosure which is intended to be limited only by the following claims.

What is claimed is:

1. A hole driver for driving a hole in a semiconductor memory device, comprising:
   a first bank control means for generating a control signal for controlling a X-hole of a first bank in response to a row active signal and a precharge signal for the first bank;
   a second bank control means for generating a control signal for controlling a X-hole of a second bank in response to a row active signal and a precharge signal for the second bank;
   a block address enable means for generating a common block address enable signal in response to output signals of the first and the second bank control means; and
   a common block address predecoding means for predecoding block address signal for each bank in response to the common block address enable signal.

2. The hole driver as recited in claim 1, wherein each first and second bank control means respectively comprises:
   a first bank control unit for generating a bank active signal, a bank precharge signal and a wordline clear signal by receiving the row active signal and the precharge signal; and
   a second bank control unit for generating a sense amplifier operation starting signal and an address setting margin control signal by receiving an output of the first bank control unit.

3. The hole driver as recited in claim 2, wherein the address setting margin control signal is enabled at a shorter time than a RAS to RAS delay time (tRRD) after the bank active signal is enabled.

4. The hole driver as recited in claim 3, wherein the block address enable means comprises:
   a first block address enable unit for generating a first block address enable signal by receiving the bank active signal and the bank precharge signal from the first bank control unit for the first bank and the address setting margin control signal from the second bank control unit for the first bank;
   a second block address enable unit for generating a second block address enable signal by receiving the bank active signal and the bank precharge signal from the first bank control unit for the second bank and the address setting margin control signal from the second bank control unit for the second bank; and
   a logic combination unit for the common block address enable signal by logically combining the first and the second block address enable signals.

5. The hole driver as recited in claim 4, wherein each of the first and second block address enable units comprises:
   a driver having a pull-up transistor whose gate receives an inverted address setting margin control signal and a pull-down transistor whose gate receives the bank active signal for corresponding bank;
   a latch for storing an output of the driver; and
   a reset transistor for resetting the latch in response to the bank precharge signal for corresponding bank.

6. The hole driver as recited in claim 5, wherein the logic combination unit includes an NAND gate receiving output signals from each driver in the first and the second block address enable unit.

7. The hole driver as recited in claim 1, wherein the block address predecoding means includes a plurality of drivers for driving the common block address enable signal and at least one inverter coupled to an output of the driver, wherein each driver operates in response to a row address signal and an inverted address signal.

* * * * *